United States Patent
Seong et al.

(10) Patent No.: US 7,799,687 B2
(45) Date of Patent: Sep. 21, 2010

(54) SLURRY COMPOSITION FOR A CHEMICAL MECHANICAL POLISHING PROCESS AND METHOD OF MANUFACTURING A SEMICONDUCTOR DEVICE USING THE SLURRY COMPOSITION

(75) Inventors: Choong-Kee Seong, Seoul (KR); Dae-Hyuk Chung, Seongnam-si (KR); Myang-Sik Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 472 days.

(21) Appl. No.: 11/907,105

(22) Filed: Oct. 9, 2007

(65) Prior Publication Data

US 2008/0085602 A1    Apr. 10, 2008

(30) Foreign Application Priority Data

Oct. 10, 2006    (KR) .................. 10-2006-0098498

(51) Int. Cl.
*H01L 21/00*    (2006.01)
(52) U.S. Cl. .................. 438/690; 438/692; 438/693
(58) Field of Classification Search .................. 438/690, 438/692–693
See application file for complete search history.

(56) References Cited

U.S. PATENT DOCUMENTS

| | | | | |
|---|---|---|---|---|
| 7,271,100 B2* | 9/2007 | Lee et al. | .................. | 438/691 |
| 7,314,578 B2* | 1/2008 | Choi et al. | .................. | 252/79.1 |
| 2005/0130428 A1* | 6/2005 | Choi et al. | .................. | 438/690 |
| 2006/0014390 A1* | 1/2006 | Lee et al. | .................. | 438/692 |
| 2008/0009136 A1* | 1/2008 | Lee et al. | .................. | 438/692 |
| 2008/0042100 A1* | 2/2008 | Lee et al. | .................. | 252/79.1 |
| 2008/0085602 A1* | 4/2008 | Seong et al. | .................. | 438/693 |
| 2008/0124913 A1* | 5/2008 | Choi et al. | .................. | 438/633 |
| 2008/0135520 A1* | 6/2008 | Sun | .................. | 216/89 |
| 2010/0081279 A1* | 4/2010 | Palmer et al. | .................. | 438/667 |

FOREIGN PATENT DOCUMENTS

| | | |
|---|---|---|
| JP | 2005-175498 | 6/2005 |
| KR | 0378180 | 3/2003 |
| KR | 1020050122754 A | 12/2005 |
| KR | 10-2006-0006276 A | 1/2006 |

OTHER PUBLICATIONS

Korean Office Action dated Aug. 31, 2007 for corresponding Korean Patent Application No. 10-2006-0098498.

* cited by examiner

*Primary Examiner*—Laura M Menz
(74) *Attorney, Agent, or Firm*—Harness, Dickey & Pierce, P.L.C.

(57) ABSTRACT

A slurry composition for a chemical mechanical polishing process and a method of manufacturing a semiconductor memory device using the slurry composition are provided. The slurry composition may include about 0.001 percent by weight to about 5 percent by weight of a ceria abrasive, about 0.001 percent by weight to about 0.1 percent by weight of a nonionic surfactant adsorbed onto a polysilicon layer forming a passivation layer on the polysilicon layer, the nonionic surfactant having a chemical structure of a triblock copolymer including a first polyethylene oxide block, a polypropylene oxide block and a second polyethylene oxide block and a remainder of water.

8 Claims, 10 Drawing Sheets

SLURRY COMPOSITION FOR A CHEMICAL MECHANICAL POLISHING PROCESS AND METHOD OF MANUFACTURING A SEMICONDUCTOR DEVICE USING THE SLURRY COMPOSITION

PRIORITY STATEMENT

This application claims the benefit of priority under 35 U.S.C. §119 from Korean Patent Application No. 10-2006-0098498, filed on Oct. 10, 2006, the entire contents of which are herein incorporated by reference.

BACKGROUND

1. Field

Example embodiments relate to a slurry composition and a method of manufacturing a semiconductor memory device using the same. Other example embodiments relate to a slurry composition including a ceria abrasive for a chemical mechanical polishing process and a method of manufacturing a semiconductor memory device using the same.

2. Description of the Related Art

In manufacturing a semiconductor memory device, structures having a flat surface may be formed on a semiconductor substrate. The structures are generally formed by performing several processes (e.g., a deposition process, a patterning process, an etching process, a polishing process, etc.). A chemical mechanical polishing (CMP) process may be frequently used to form the structures.

In the CMP process, a semiconductor substrate to be polished may be positioned on a wafer carrier. A slurry composition including an abrasive is provided between the semiconductor substrate and a polishing pad. While the semiconductor substrate is in contact with the polishing pad, the semiconductor substrate and the polishing pad are simultaneously rotated and pressurized. As such, a surface of the semiconductor substrate may be planarized. The surface of the semiconductor substrate may be mechanically polished by rubbing the abrasive included in the slurry composition and a rugged surface of the polishing pad against the semiconductor substrate. Simultaneously, the surface of the semiconductor substrate may be chemically polished by reacting chemical components of the slurry composition with surface substances of the semiconductor substrate.

A polishing efficiency of the CMP process may be determined by factors such as a CMP apparatus, a chemical composition of the slurry composition, a type of the polishing pad, etc. The chemical composition of the slurry composition may contribute to the polishing efficiency. A single slurry composition may exhibit different polishing rates for various layers according to the type, or properties, of the layers to be polished.

A layer may be selectively polished from the other layers. For example, at least one of an oxide layer, a nitride layer, a polysilicon layer and a metal layer, which are widely used to manufacture semiconductor devices, may be selectively polished by the CMP process due to the differences between the polishing rates of the layer(s) to be polished.

Slurry compositions, which have a substantially high polishing rate for an oxide layer and a substantially low polishing rate for a silicon nitride layer, are widely used. As such, a slurry composition having a polishing selectivity between a polysilicon layer and an oxide layer may be necessary. For example, when an oxide layer formed on a polysilicon layer that will be used as a floating gate is polished, a slurry composition having a substantially high polishing rate for the oxide layer and a substantially low polishing rate for the polysilicon layer may be desirable. As the integration of semiconductor devices increases, the degree of uniformity of the thickness of the floating gate may influence characteristics of the semiconductor devices. Thus, there may be an increased need for slurry compositions having such polishing characteristics.

The slurry composition having a high polishing selectivity for an oxide layer relative to a polysilicon layer may be desirable in order to increase the polishing efficiency and/or to reduce processing cost.

SUMMARY

Example embodiments relate to a slurry composition and method of manufacturing a semiconductor memory device using the same.

Example embodiments provide a slurry composition including a ceria abrasive for a chemical mechanical polishing process that may have a substantially high polishing selectivity for an oxide layer relative to a polysilicon layer. Example embodiments provide a method of manufacturing a semiconductor memory device using the above-mentioned slurry composition.

According to example embodiments, a slurry composition for a chemical mechanical polishing process may include about 0.001 percent by weight to about 5 percent by weight of a ceria abrasive, about 0.001 percent by weight to about 0.1 percent by weight of a nonionic surfactant adsorbed onto a polysilicon layer to form a passivation layer on the polysilicon layer, the nonionic surfactant having a chemical structure of a triblock copolymer and water. The triblock copolymer may include a first polyethylene oxide block, a polypropylene oxide block and a second polyethylene oxide block.

According to example embodiments, the nonionic surfactant may be represented by Formula (1),

FORMULA (1)

wherein x, y and z independently represent integers in a range of 10 to 1,000.

In example embodiments, the first and the second polyethylene oxide blocks may have a hydrophilic-lipophilic balance (HLB) value in a range of about 10 to about 15, respectively. The polypropylene oxide block may have an HLB value in a range of about 28 to about 32.

According to example embodiments, the slurry composition may include about 0.1 percent by weight to about 3.5 percent by weight of the ceria abrasive, about 0.005 percent by weight to about 0.055 percent by weight of the nonionic surfactant adsorbed onto a surface of a polysilicon layer and protecting the polysilicon layer from the abrasive and water.

According to example embodiments, the ceria abrasive may have an average particle size in a range of about 120 nm to about 160 nm. The slurry composition may have a pH value in a range of about 7 to about 12.

According to example embodiments, the slurry composition may include a dispersing agent for dispersing the ceria abrasive.

According to example embodiments, there is provided a method of manufacturing a semiconductor device. In the method of manufacturing the semiconductor device, a polysilicon layer pattern may be formed on a substrate. The substrate may be partially etched using the polysilicon layer pattern as an etching mask to form a trench in an upper portion of the substrate. A silicon oxide layer may be formed on the substrate covering the polysilicon layer pattern and filling the trench. The silicon oxide layer may be polished using a slurry composition until the polysilicon layer pattern is exposed to form an isolation layer in the trench. The slurry composition includes about 0.001 percent by weight to about 5 percent by weight of a ceria abrasive, about 0.001 percent by weight to about 0.1 percent by weight of a nonionic surfactant adsorbed onto the polysilicon layer pattern to form a passivation layer on the polysilicon layer pattern, the nonionic surfactant having a chemical structure of a triblock copolymer and water. The triblock copolymer may include a first polyethylene oxide block, a polypropylene oxide block and a second polyethylene oxide block. A structure may be formed on the substrate having the isolation layer formed thereon. The structure may include a gate insulation layer and a conductive pattern.

According to example embodiments, a polishing selectivity of the silicon oxide layer relative to the polysilicon layer pattern may be in a range of about 100:1 to about 150:1.

BRIEF DESCRIPTION OF THE DRAWINGS

Example embodiments will be more clearly understood from the following detailed description taken in conjunction with the accompanying drawings. FIGS. 1-17 represent non-limiting, example embodiments as described herein.

DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like manner (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, when the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a slurry composition and a method of manufacturing a semiconductor memory device using the same.

Example embodiments provide a slurry composition including a ceria abrasive for a chemical mechanical polishing process that may have a substantially high polishing selectivity for an oxide layer relative to a polysilicon layer. Example embodiments provide a method of manufacturing a semiconductor memory device using the above-mentioned slurry composition.

A slurry composition for a chemical mechanical polishing (CMP) process according to example embodiments may include a ceria ($CeO_2$) abrasive and a nonionic surfactant that may increase a polishing selectivity of a hydrophilic layer relative to a hydrophobic layer.

The slurry composition may have a substantially high polishing selectivity of a hydrophilic layer to a hydrophobic layer. As such, the slurry composition may be more effectively used in a polishing process for polishing the hydrophilic layer using the hydrophobic layer as a polishing stop layer. For example, the hydrophilic layer may be a silicon oxide layer and the hydrophobic layer may be a polysilicon layer.

The slurry composition according to example embodiments may include a ceria abrasive, a nonionic surfactant adsorbed onto the polysilicon layer forming a passivation layer on the polysilicon layer and a remainder of water.

The ceria abrasive may exhibit a substantially high polishing rate for the hydrophilic layer and a substantially low polishing rate for the hydrophobic layer. As such, the slurry composition including the ceria abrasive may have a substantially high polishing rate for a hydrophilic silicon oxide layer and a substantially low polishing rate for a hydrophobic polysilicon layer.

The polishing rate of a silica abrasive (e.g., fumed silica or colloidal silica) for the polysilicon layer may be substantially greater than that of the ceria abrasive. The silica abrasive may excessively etch the polysilicon layer. As such, the polysilicon layer may not properly function as a polishing stop layer.

A particle size and/or an amount of the ceria abrasive included in the slurry composition may influence the polishing efficiency of the polishing process. When the particle size of the ceria abrasive is greater than about 400 nm, stress applied to the polysilicon layer may increase during the polishing process when the slurry composition contacts the polysilicon. Grains formed on a surface of the polysilicon layer may be partially separated from the polysilicon layer. As the particle size of the ceria abrasive decreases, damage to the polysilicon layer may decrease when the slurry composition contacts with the polysilicon layer. When the particle size of the ceria abrasive is less than about 50 nm, then the polishing efficiency of the polishing process may decrease. The particle size of the ceria abrasive may be selected in order to prevent (or suppress) deterioration of a surface roughness of the polysilicon layer during the polishing process. For example, the ceria abrasive may have a particle size of about 50 nm to about 400 nm. The ceria abrasive may have a particle size of about 120 nm to about 160 nm.

A polishing rate of the silicon oxide layer and a polishing selectivity of the silicon oxide layer relative to the polysilicon layer may vary in accordance with the amount of the ceria abrasive. When the amount of the ceria abrasive is less than about 0.001 percent by weight, a polishing efficiency of a CMP process for polishing the silicon oxide layer may decrease. The silicon oxide layer may not be polished with a uniform thickness. When the amount of the ceria abrasive is greater than about 5 percent by weight, then the polishing rate of the polysilicon layer functioning as a polishing stop layer may increase. The slurry composition may include the ceria abrasive in a range of about 0.001 percent by weight to about 5 percent by weight based on a total weight of the slurry composition. The slurry composition may include the ceria abrasive in a range of about 0.1 percent by weight to about 3.5 percent by weight based on the total weight of the slurry composition.

The slurry composition may include a nonionic surfactant having a chemical structure of a triblock copolymer including a first polyethylene oxide block, a polypropylene oxide block and a second polyethylene oxide block.

According to example embodiments, the nonionic surfactant may be represented by Formula (1),

FORMULA (1)

wherein x, y and z independently represent integers in a range of 10 to 1,000.

According to example embodiments, the first polyethylene oxide block and the second polyethylene oxide block included in the nonionic surfactant may have a hydrophilic-lipophilic balance (HLB) value in a range of about 10 to about 15, respectively. The polypropylene oxide block may have an HLB value in a range of about 28 to about 32. For example, the first and the second polyethylene oxide block may have a HLB value of about 12, respectively, and the polypropylene oxide block may have a HLB value of about 30. The HLB value is a measure of a degree to which a surfactant is hydrophilic or lipophilic. A small HLB value indicates that the surfactant is more lipophilic. A large HLB value indicates that the surfactant is more hydrophilic.

The nonionic surfactant includes a hydrophobic portion and a hydrophilic portion. The hydrophobic portion of the nonionic surfactant may adsorb onto a surface of the hydrophobic polysilicon layer in order to protect the polysilicon layer from being damaged by the ceria abrasive. The nonionic surfactant may form a passivation layer on the polysilicon layer in order to prevent particles of the ceria abrasive from direct contacting the polysilicon layer. The polishing rate of the polysilicon layer may substantially decrease. The nonionic surfactant may maintain the polishing selectivity between the polysilicon layer and the silicon oxide layer in the polishing process. Dishing and/or erosion defects may decrease due to the protection of the hydrophobic portion of the nonionic surfactant, increasing the uniformity of the polishing process.

When the slurry composition includes less than about 0.001 percent by weight of the nonionic surfactant based on a total weight of the slurry composition, the nonionic surfactant may not sufficiently protect the polysilicon layer from the ceria abrasive in the polishing process. When the amount of the nonionic surfactant is greater than about 0.1 percent by weight, the polishing efficiency of the polishing process for polishing the silicon oxide layer may decrease. The slurry composition may include the nonionic surfactant in a range of about 0.001 percent by weight to about 0.1 percent by weight. The slurry composition may include the nonionic surfactant in a range of about 0.005 percent by weight to about 0.055 percent by weight based on a total weight of the slurry composition.

The nonionic surfactant may be represented by Formula (1),

FORMULA (1)

wherein x, y and z independently represent integers in a range of 10 to 1,000.

According to example embodiments, the slurry composition may have a pH value in a range of about 7 to about 12. When the pH value is in the range of about 7 to about 12, a difference in zeta potentials between the silicon oxide layer and the polysilicon layer may be observed. When the pH value of the slurry composition is in the range of about 7 to about 12, the polishing rate of the silicon oxide layer may increase and/or the polishing rate of the polysilicon layer may be reduced.

The remainder of the slurry composition according to example embodiments may include a solvent. The solvent may increase mobility of the slurry composition. Examples of the solvent that may be used in the slurry composition include purified water, ultra purified water, deionized water, distilled water or the like.

According to example embodiments, the slurry composition may include a dispersing agent for dispersing the ceria abrasive. The dispersing agent may increase the polishing efficiency of the ceria abrasive. The dispersing agent may include a polymeric substance (e.g., polyacrylic acid). The polymeric substance included in the dispersing agent may adsorb onto the particles of the ceria abrasive to enhance dispersibility of the ceria abrasive in the slurry composition by using electrostatic repulsion and/or steric hindrance. The increased dispersibility of the ceria abrasive may inhibit an agglomeration of components of the slurry composition. The dispersing agent may increase viscosity of the slurry composition to reduce (or decrease) a noise (or interference) during the polishing process.

An amount of the dispersing agent may vary according to the amount of the ceria abrasive. For example, the slurry composition may include the dispersing agent in a range of about 0.5 percent by weight to about 3.5 percent by weight based on a total amount of the slurry composition.

The slurry composition according to example embodiments will be more described with reference to following examples and comparative examples.

EXAMPLE 1

A slurry composition was prepared by mixing about 0.5 percent by weight of a ceria abrasive, about 0.1 percent by weight of a dispersing agent, about 0.005 percent by weight of a nonionic surfactant and a remainder of deionized water. In the preparation of the slurry composition, a mixture of a ceria particle known as "HS8005A" (a trade name, manufactured by Hitachi Chemical, Japan) and an additive known as "HS8102GP" (a trade name, manufactured by Hitachi Chemical, Japan) was used as the ceria abrasive. Polyacrylic acid was used as the dispersing agent and "PL-64" (a trade name, manufactured by IC Chem., Korea) was used as the nonionic surfactant.

EXAMPLE 2

A slurry composition was prepared by mixing about 0.5 percent by weight of a ceria abrasive, about 1.0 percent by weight of a dispersing agent, about 0.01 percent by weight of a nonionic surfactant and a remainder of deionized water. In the preparation of the slurry composition, a mixture of "HS8005A" and "HS8102GP" was used as the ceria abrasive. Polyacrylic acid was used as the dispersing agent and "PL-64" was used as the nonionic surfactant.

EXAMPLE 3

A slurry composition was prepared by mixing about 0.5 percent by weight of a ceria abrasive, about 1.0 percent by weight of a dispersing agent, about 0.015 percent by weight of a nonionic surfactant and a remainder of deionized water. In the preparation of the slurry composition, a mixture of "HS8005A" and "HS8102GP" was used as the ceria abrasive. Polyacrylic acid was used as the dispersing agent and "PL-64" was used as the nonionic surfactant.

EXAMPLE 4

A slurry composition was prepared by mixing about 0.5 percent by weight of a ceria abrasive, about 1.0 percent by weight of a dispersing agent, about 0.02 percent by weight of a nonionic surfactant and a remainder of deionized water. In the preparation of the slurry composition, a mixture of "HS8005A" and "HS8102GP" was used as the ceria abrasive. Polyacrylic acid was used as the dispersing agent and "PL-64" was used as the nonionic surfactant.

EXAMPLE 5

A slurry composition was prepared by mixing about 0.5 percent by weight of a ceria abrasive, about 1.0 percent by weight of a dispersing agent, about 0.025 percent by weight of a nonionic surfactant and a remainder of deionized water. In the preparation of the slurry composition, a mixture of "HS8005A" and "HS8102GP" was used as the ceria abrasive. Polyacrylic acid was used as the dispersing agent and "PL-64" was used as the nonionic surfactant.

COMPARATIVE EXAMPLE

A slurry composition was prepared by mixing about 0.5 percent by weight of a ceria abrasive, about 1.0 percent by weight of a dispersing agent and a remainder of deionized water. In the preparation of the slurry composition, a mixture of "HS8005A" and "HS8102GP" was used as the ceria abrasive. Polyacrylic acid was used as the dispersing agent.

Evaluation of Polishing Selectivities According to Amount of Nonionic Surfactants To evaluate polishing rates and polishing selectivities in accordance with the amount of nonionic surfactants, a CMP process was performed using one of the slurry compositions prepared in Examples 1 to 5 and Comparative Example on substrates including an oxide layer and a polysilicon layer functioning as a polishing stop layer. The CMP process was performed using Reflexion (a trade name, manufactured by AMAT). The CMP process was performed under the process conditions shown in Table 1. The polishing rates of the layers and the polishing selectivities of the oxide layer to the polysilicon layer are shown in Table 2.

TABLE 1

| PROCESS CONDITIONS | | |
| --- | --- | --- |
| Pressure (psi) | Carrier | 9.6 |
| | Zone 1 | 8.5 |
| | Zone 2 | 4.1 |
| | Zone 3 | 4.0 |
| | Zone 4 | 3.6 |
| | Zone 5 | 3.5 |
| Rotation Speed (rpm) | Head | 63 |
| | Platen | 67 |
| Flow Rate of Slurry Composition (mL/min) | | 200 |
| Pressure of Conditioner (psi) | | 6.0 |
| Rotation Speed of Conditioner (rpm) | | 100 |

TABLE 2

| | POLISHING RATE OF OXIDE LAYER (Å/MIN) | POLISHING RATE OF POLYSILICON LAYER (Å/MIN) | POLISHING SELECTIVITY |
| --- | --- | --- | --- |
| Example 1 | 2,633 | 19 | 139:1 |
| Example 2 | 2,533 | 17 | 151:1 |
| Example 3 | 2,443 | 15 | 160:1 |
| Example 4 | 2,332 | 15 | 161:1 |
| Example 5 | 2,294 | 14 | 164:1 |

TABLE 2-continued

| | POLISHING RATE OF OXIDE LAYER (Å/MIN) | POLISHING RATE OF POLYSILICON LAYER (Å/MIN) | POLISHING SELECTIVITY |
| --- | --- | --- | --- |
| Comparative Example | 3,480 | 374 | 9:1 |

Figure 1:
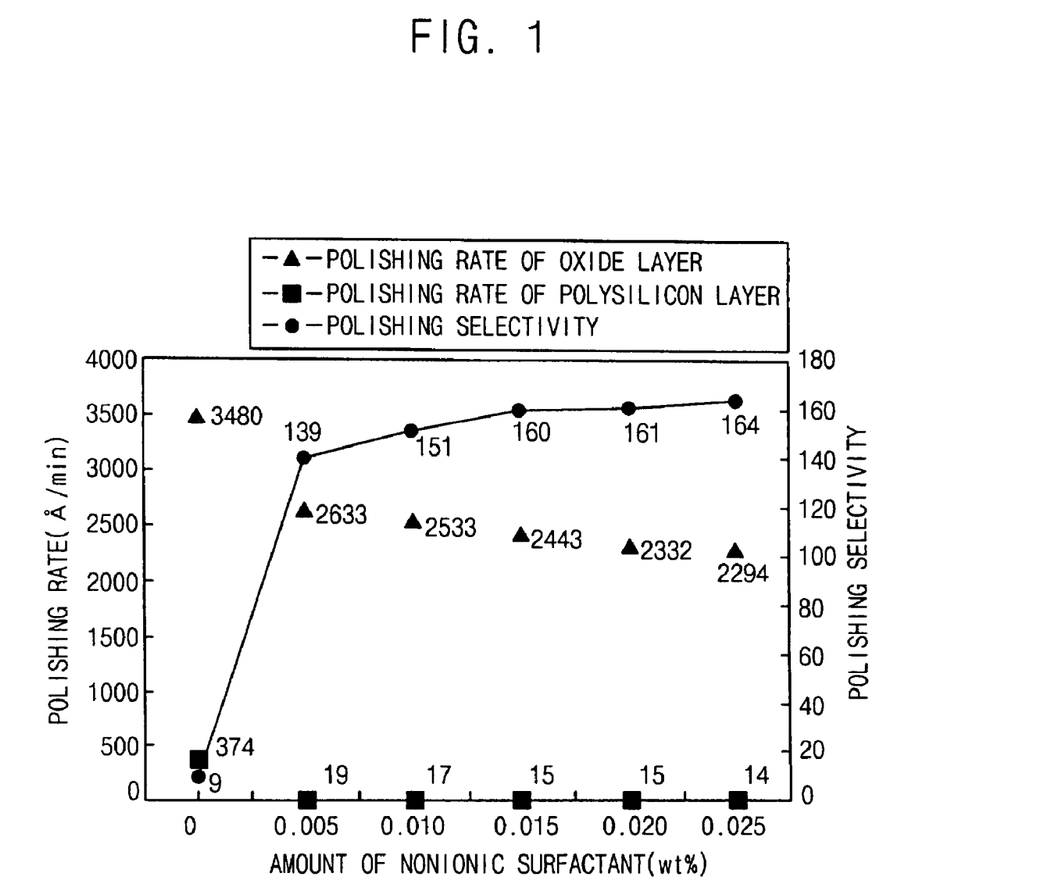
FIG. 1 is a graph illustrating polishing rates and polishing selectivities for a polysilicon layer and an oxide layer, which were polished using slurry compositions prepared in Examples 1 to 5 and Comparative Example.

FIG. 1 is a graph illustrating polishing rates and polishing selectivities for a polysilicon layer and an oxide layer, which were polished using the slurry compositions prepared according to Examples 1 to 5 and Comparative Example.

As shown in Table 2 and illustrated in FIG. 1, the slurry compositions prepared according to Examples 1 to 5 had substantially high polishing rates for the oxide layer of between about 2,200 Å/min and about 2,700 Å/min and substantially low polishing rates for the polysilicon layer of between about 10 Å/min to about 20 Å/min. The slurry compositions prepared according to Examples 1 to 5 had substantially high polishing selectivities of at least about 140:1. As such, the slurry composition according to example embodiments may be more effectively applied to the CMP process for polishing the oxide layer using the polysilicon layer as a polishing stop layer.

Figure 2:
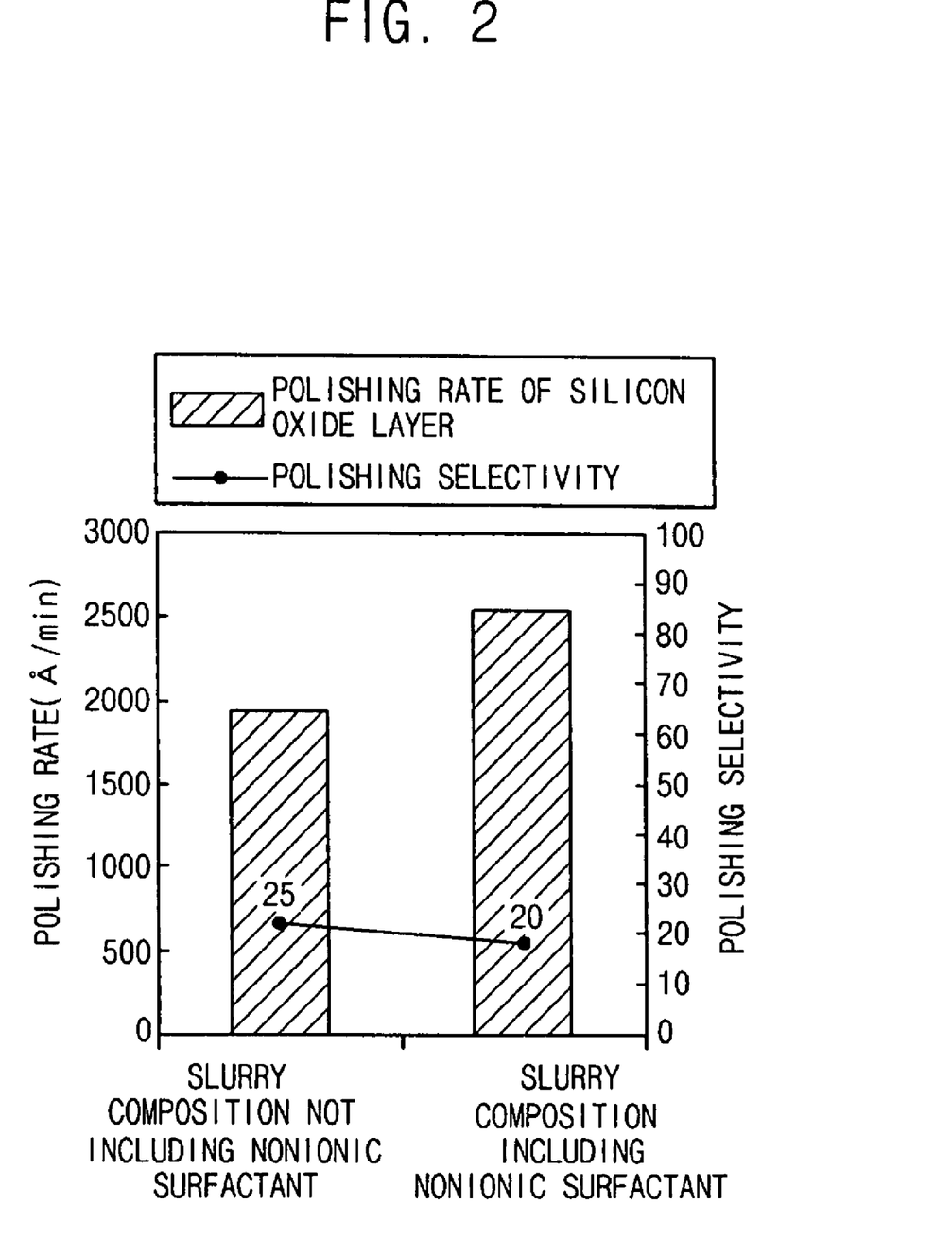
FIG. 2 is a graph illustrating polishing selectivities between a silicon oxide layer and a silicon nitride layer, which were polished using a slurry composition including the nonionic surfactant according to example embodiments and a slurry composition not including the nonionic surfactant according to the conventional art.
Figure 3:
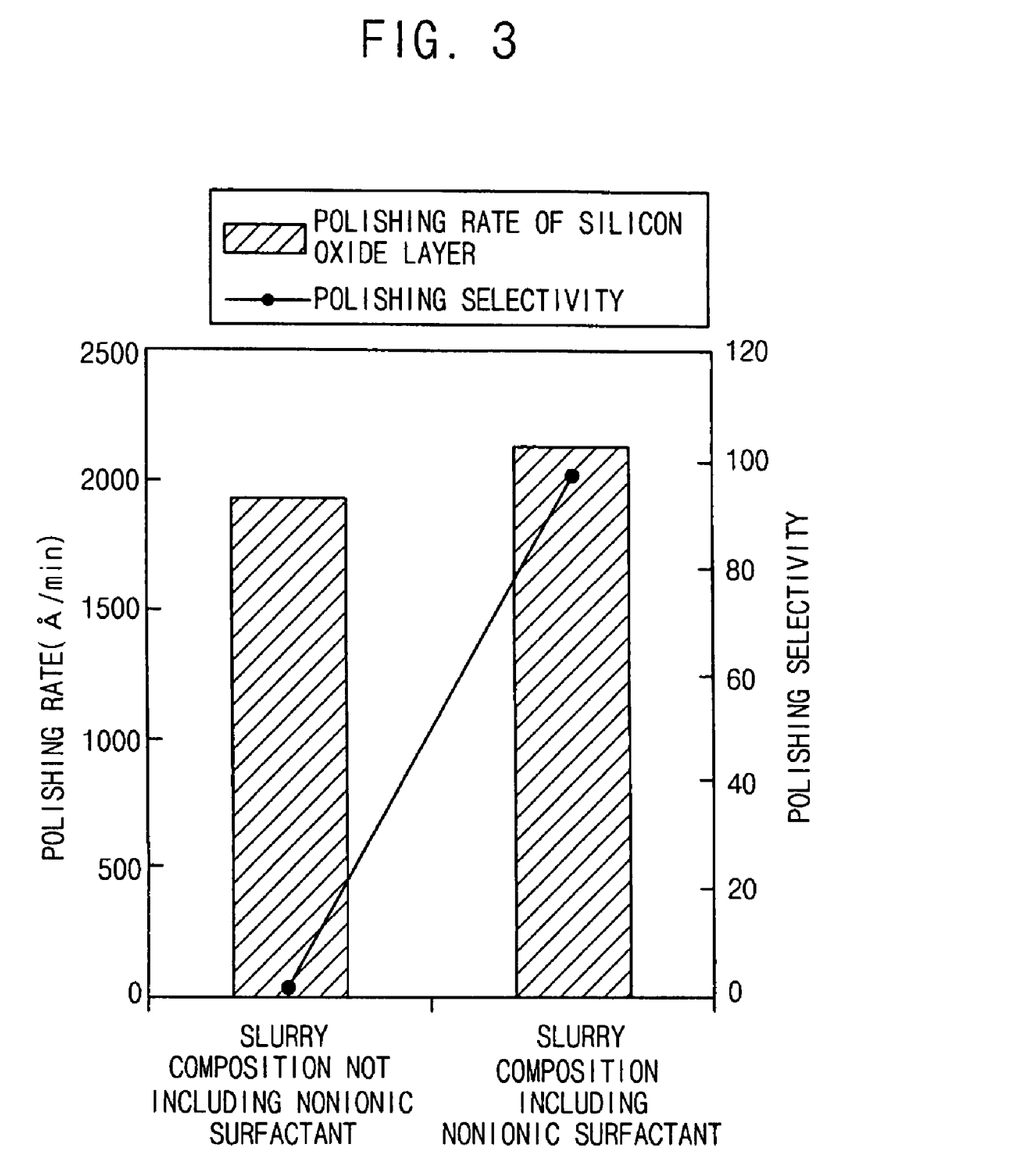
FIG. 3 is a graph illustrating polishing selectivities between a silicon oxide layer and a polysilicon layer, which were polished using a slurry composition including the nonionic surfactant according to example embodiments and a slurry composition not including the nonionic surfactant according to the conventional art.

FIG. 2 is a graph illustrating polishing selectivities between a silicon oxide layer and a silicon nitride layer, which were polished using a slurry composition including the nonionic surfactant according to example embodiments and a slurry composition not including the nonionic surfactant according to the conventional art. FIG. 3 is a graph illustrating polishing selectivities of a silicon oxide layer to a polysilicon layer, which were polished using a slurry composition including the nonionic surfactant according to example embodiments and a slurry composition not including the nonionic surfactant according to the conventional art.

As shown in FIG. 2, the slurry composition not including the nonionic surfactant has a substantially high polishing selectivity of the silicon oxide layer to the silicon nitride layer, which is at least about 25:1. As shown in FIG. 3, the slurry composition not including the nonionic surfactant has a low polishing selectivity of the silicon oxide layer to the polysilicon layer.

As shown in FIG. 2, the slurry composition including the nonionic surfactant has a substantially high polishing selectivity of the silicon oxide layer to the silicon nitride layer, which is at least about 20:1. As shown in FIG. 3, the slurry composition including the nonionic surfactant has a high polishing selectivity of the silicon oxide layer to the polysilicon layer, which is at least 100:1.

The slurry composition including the nonionic surfactant may have the polishing selectivity of the silicon oxide layer relative to the silicon nitride layer, which is substantially similar (or comparable) to that of the conventional slurry composition not including the nonionic surfactant. The slurry composition including the nonionic surfactant may have increased polishing selectivity of the silicon oxide layer relative to the polysilicon layer.

The slurry composition including the nonionic surfactant has a polishing rate for the silicon oxide layer of at least about 2,000 Å/min. As such, the slurry composition may be more effectively used in a polishing process for polishing the silicon oxide layer.

Figure 4:
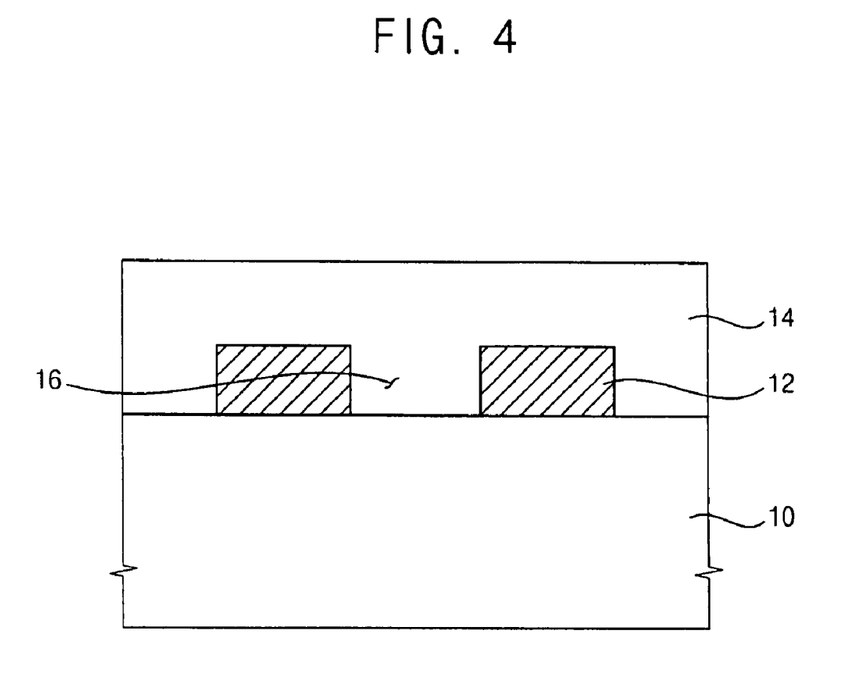
FIGS. 4 to 5 are diagrams illustrating cross-sectional views of a method of polishing an object layer according to example embodiments.
Figure 5:
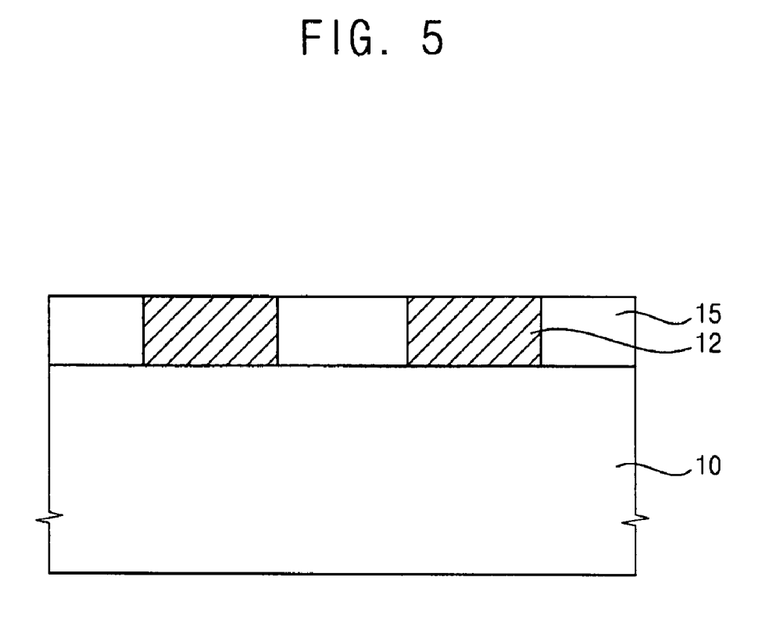

FIGS. 4 to 5 are diagrams illustrating cross-sectional views of a method of polishing an object layer according to example embodiments.

Referring to FIG. 4, a polishing stop layer 12 may be formed on a substrate 10. The polishing stop layer 12 may be formed directly on the substrate 10. The polishing stop layer 12 may be formed on a structure (not shown) (e.g., an electrode, a conductive layer, a conductive layer pattern, an insulation layer or an insulation layer pattern) interposed between the polishing stop layer 12 and the substrate 10.

The polishing stop layer 12 may include a polysilicon layer. In other example embodiments, the polishing stop layer 12 may include a silicon nitride layer formed using silicon nitride. In accordance with yet example embodiments, the polysilicon layer may be used to form a floating gate on the substrate 10. In accordance with example embodiments, the polishing stop layer 12 may include an opening 16 that exposes an underlying structure.

An object layer 14 may be formed on polishing stop layer 12. The object layer 14 may be formed using a hydrophilic material. For example, the object layer 14 may be formed using a silicon oxide. Examples of the silicon oxide may include phosphor silicate glass (PSG), borophosphosilicate glass (BPSG), undoped silica glass (USG), spin-on-glass (SOG), tetraethyl orthosilicate (TEOS), plasma enhanced-TEOS (PE-TEOS), high density plasma-chemical vapor deposition (HDP-CVD) oxide or combinations thereof. In accordance with example embodiments, the object layer 14 may be formed having a thickness sufficient to cover the polishing stop layer 12.

Referring to FIG. 5, the object layer 14 may be chemically and mechanically polished until the polishing stop layer 12 is exposed to form an object layer pattern 15 having a substantially level (or planar) upper surface.

A slurry composition including about 0.001 percent by weight to about 5 percent by weight of a ceria abrasive, about 0.001 to about 0.1 percent by weight of a non ionic surfactant adsorbed onto a polysilicon layer forming a passivation layer on the polysilicon layer, the nonionic surfactant having a chemical structure of a triblock copolymer including a first polyethylene oxide block, a polypropylene oxide block, a second polyethylene oxide block and a remainder of water is provided on a polishing pad (not shown). The object layer 14 may be polished by rubbing the object layer 14 with the polishing pad to partially remove an upper portion of the object layer 14 from the substrate 10. According to example embodiments, the polishing process may be performed until the polishing stop layer 12 is exposed. As such, the object layer pattern 15 may be formed from the object layer 14.

The polishing process may be performed by rotating the polishing pad and the substrate 10 on which the object layer 14 is formed. During the polishing process, the substrate 10 may contact the polishing pad under pressurized conditions. The object layer 14 may be chemically polished by the slurry composition. The object layer 14 may be mechanically polished by rotation and the pressurization. The slurry composition was previously described so any further explanations thereof will be omitted for the sake of brevity.

According to example embodiments, the first polyethylene oxide block and the second polyethylene oxide block may have a HLB value in a range of about 10 to about 15, respectively. The polypropylene oxide block may have a HLB value in a range of about 28 to about 32.

The nonionic surfactant included in the slurry composition includes a hydrophobic portion and a hydrophilic portion. The polypropylene oxide block, which is the hydrophobic portion of the nonionic surfactant, may contact (or are attached to) the hydrophobic layer. The first and the second polyethylene oxide blocks, which are the hydrophilic portion of the nonionic surfactant, may contact (or are attached to) the slurry composition. The hydrophobic portion of the nonionic surfactant may adsorb onto a surface of the hydrophobic layer to protect the hydrophobic layer from the ceria abrasive. The nonionic surfactant may form a passivation layer on the hydrophobic layer to prevent particles of the ceria abrasive from making direct contact with the hydrophobic layer. As such, the polishing rate of the hydrophobic layer may be significantly reduced.

The nonionic surfactant (or most of) may adsorb onto the hydrophobic layer. As such, the slurry composition may not substantially decrease the polishing rate of the hydrophilic layer. The slurry composition may have a high polishing rate for the hydrophilic layer and a low polishing rate for the hydrophobic layer due to the protective effect of the nonionic surfactant.

The nonionic surfactant may uniformly maintain the polishing selectivity of the polysilicon layer, which is hydrophobic, to the silicon oxide layer, which is hydrophilic, during the polishing process. For example, the polishing rate of the slurry composition for the silicon oxide layer may be between about 2,500 Å/min to about 3,000 Å/min. The polishing rate of the slurry composition for the polysilicon layer may be between about 50 Å/min to about 110 Å/min, or between about 60 Å/min to about 100 l/min. The polishing selectivity of the silicon oxide layer to the polysilicon layer in the slurry composition may be in a range of about 100:1 to about 150:1.

The slurry composition may be effectively used in a polishing process for polishing a silicon oxide layer using a silicon nitride layer as a polishing stop layer, the silicon nitride layer being formed on the silicon oxide layer.

In accordance with example embodiments, the above-mentioned method of polishing the object layer may be used for manufacturing various structures of semiconductor devices (e.g., an isolation layer, a gate structure, a wiring structure, a pad structure, a contact, a capacitor, etc.).

FIGS. 6 to 10 are diagrams illustrating perspective views of methods of manufacturing a semiconductor device according to example embodiments.

Figure 6:
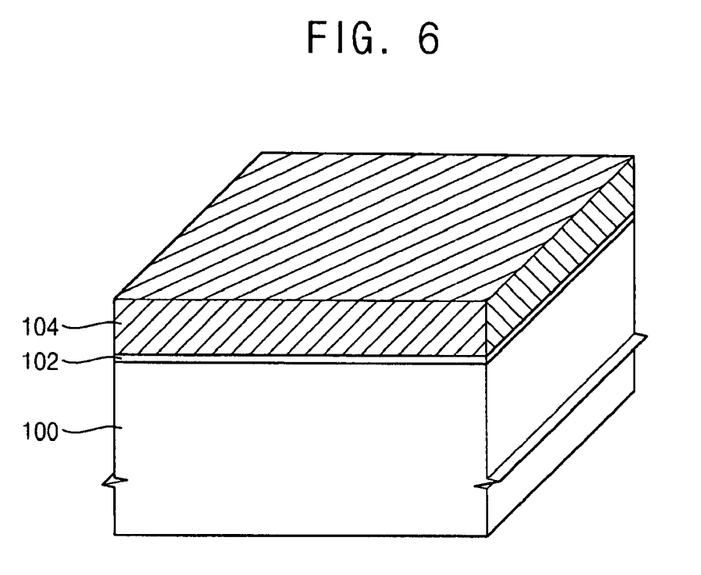
FIGS. 6 to 10 are diagrams illustrating of perspective views methods of manufacturing a semiconductor device according to example embodiments.

Referring to FIG. 6, a tunnel oxide layer 102 and a polysilicon layer 104 may be formed on a substrate 100. The polysilicon layer 104 may be used to form a floating gate. Examples of the substrate 100 may include a silicon wafer, a germanium substrate, a silicon germanium substrate, a silicon-on-insulator (SOI) substrate or the like.

The tunnel oxide layer 102 may be formed by a thermal oxidation process. The polysilicon layer 104 may be formed on the tunnel oxide layer 102 by depositing undoped polysilicon or amorphous silicon through a low pressure chemical vapor deposition (LPCVD) process and doping the deposited layer with impurities. The LPCVD process may be performed at a temperature of about 500° C. to about 600° C. The polysilicon layer 104 may be doped with impurities using a $POCl_3$ diffusion process, an ion implantation process, an in-situ doping process or the like.

Figure 7:
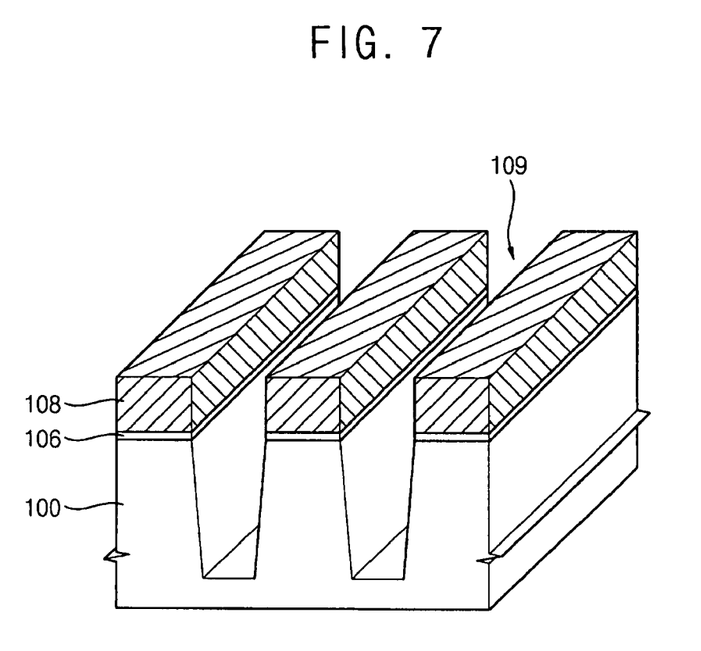

Referring to FIG. 7, a photoresist pattern (not illustrated) may be formed on the polysilicon layer 104. The polysilicon layer 104 and the tunnel oxide layer 102 may be partially etched using the photoresist pattern as an etching mask to form a polysilicon layer pattern 108 and a tunnel oxide layer pattern 106 on the substrate 100. A trench 109 may be formed on the upper portion of the substrate 100 by partially etching the substrate 100 using the polysilicon layer pattern 108 and the tunnel oxide layer pattern 106 as etch masks. The trench 109 may be used to establish an active region and a field region of the substrate 100.

The photoresist pattern may be formed on the polysilicon layer 104 to partially expose the polysilicon layer 104. Portions of the substrate 100 exposed by the photoresist pattern may be used as the active region. Other portions of the substrate masked by the photoresist pattern may be used as the field region.

In accordance with example embodiments, an organic anti-reflective layer (not illustrated) may be formed on the polysilicon layer 104. The organic anti-reflective layer may prevent (or decrease) deterioration of a side surface profile of the photoresist pattern. The deterioration may be cause by diffused reflection in a subsequent photolithography process. The organic anti-reflective layer may be formed using silicon oxynitride (SiON).

The polysilicon layer 104, the tunnel oxide layer 102 and the substrate 100 may be successively etched using the photoresist pattern as an etching mask to form the polysilicon layer pattern 108, the tunnel oxide layer pattern 106 and the trench 109, respectively. The photoresist pattern may be removed from the substrate 100 by performing an ashing process and/or a stripping process.

The trench 109 may be formed by a dry etching process. In accordance with example embodiments, a cleaning process may be performed on the substrate to remove etching residues from the trench, after performing the dry etching process. The cleaning process may be performed using a cleaning solution. Examples of the cleaning solution may include an aqueous solution including hydrofluoric acid or a standard cleaning 1 (SC1) solution. Portions of a layer formed using an oxide may be partially removed during the cleaning process.

According to example embodiments, when the trench 109 is formed on the upper portion of the substrate 100, an oxide layer (not illustrated) may be formed on a sidewall and a bottom of the trench 109 for curing (or repairing) damage to the trench 109. The damage may be generated (or formed) during the dry etching process. The oxide layer may be formed by a thermal oxidation process.

A liner film (not illustrated) may be formed on a sidewall and a bottom of the trench 109. The liner film may reduce stress in an isolation layer pattern 112 formed to fill up the trench 109 in a subsequent process. The liner film may prevent impurities from penetrating into the field region of the substrate 100. The liner film may be formed of a nitride. The liner film may be formed by a chemical vapor deposition (CVD) process.

Figure 8:
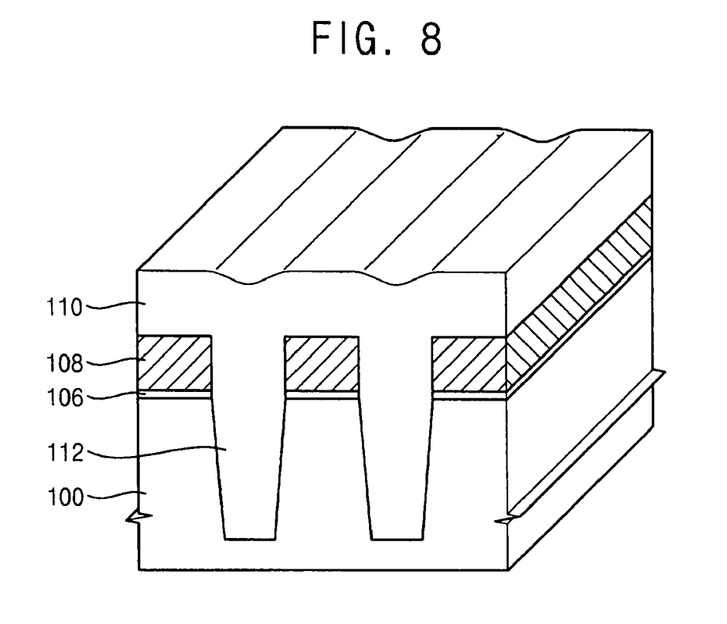

Referring to FIG. 8, a silicon oxide layer 110 may be formed on the polysilicon layer pattern 108 to fill up the trench 109.

The silicon oxide layer 100 may be formed using an oxide that has desirable gap-filling characteristics. The silicon oxide layer 100 may be formed by a CVD process. Examples of the silicon oxide may include USG, tetraethyl orthosilicate (TEOS), undoped silica glass (USG) HDP-CVD oxide or the like.

Figure 9:
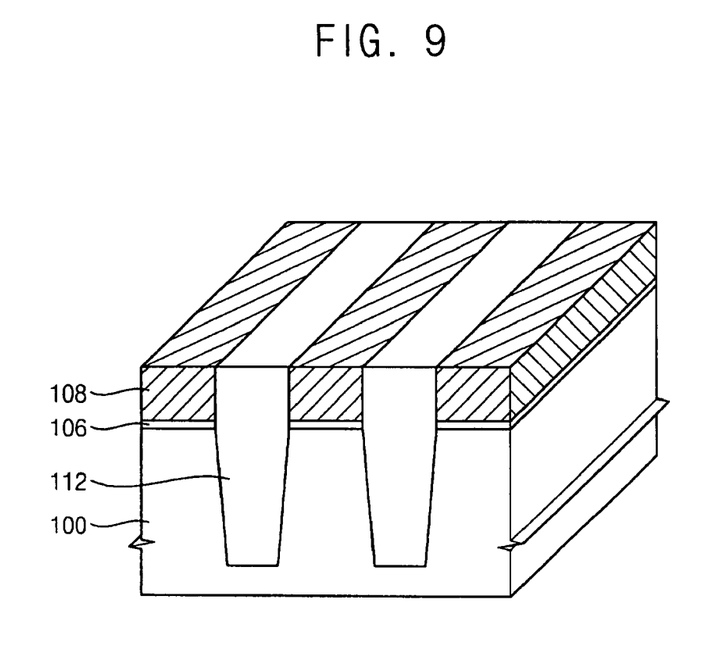

Referring to FIG. 9, the silicon oxide layer 110 may be polished by a CMP process until the polysilicon layer pattern 108 is exposed. The isolation layer pattern 112 may be formed in the trench 109.

The silicon oxide layer 110 may be polished using a slurry composition including about 0.001 percent by weight to about 5 percent by weight of a ceria abrasive, about 0.001 percent by weight to about 0.1 percent by weight of a nonionic surfactant adsorbed onto a polysilicon layer to form a passivation layer on the polysilicon layer, the nonionic surfactant having a chemical structure of a triblock copolymer including a first polyethylene oxide block, a polypropylene oxide block and a second polyethylene oxide block and a remainder of water. The silicon oxide layer 110 may be polished by rubbing the silicon oxide layer 110 with a polishing pad to partially remove an upper portion of the silicon oxide layer 110 from the substrate 100. The polishing process may be performed until the polysilicon layer pattern 108 is exposed. The polishing process and the slurry composition are previously described so any further explanations thereof will be omitted for the sake of brevity.

According to example embodiments, an annealing process may be performed on the isolation layer pattern 112 to densify the isolation layer pattern 112. A wet etching rate of the isolation layer pattern 112 in a cleaning solution may be reduced after performing the annealing process. The annealing process may be performed at a high temperature in a range of about 800° C. to about 1,050° C. The annealing process may be performed under an atmosphere including an inert gas.

Figure 10:
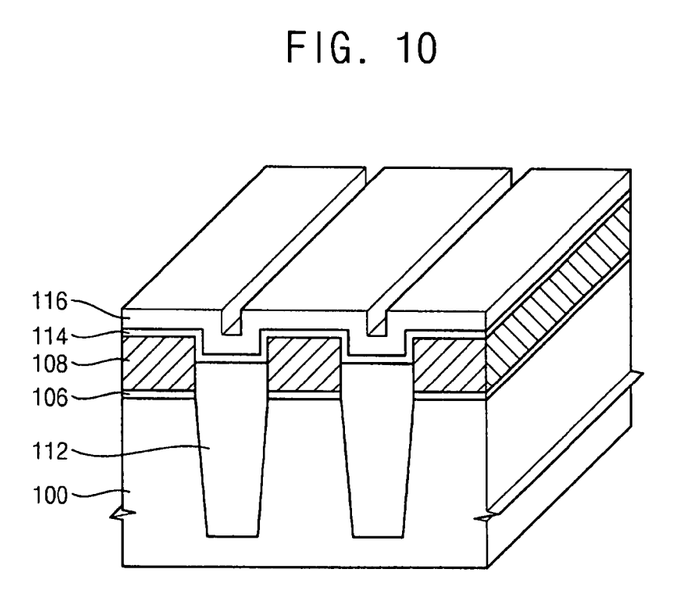

Referring to FIG. 10, a dielectric layer 114 may be formed on the polysilicon layer pattern 108 and the isolation layer pattern 112. A conductive layer 116 for a control gate may be formed on the dielectric layer 114.

The dielectric layer 114 may electrically insulate the polysilicon layer pattern 108 from the conductive layer 116 for a control gate. The dielectric layer 114 may have a multi-layered structure (not shown) in which a lower oxide layer, a nitride layer and an upper oxide layer are sequentially stacked. The dielectric layer 114 may be formed using a material that has a substantially high dielectric constant.

The dielectric layer 114 may be formed by an LPCVD process, an ALD process, a CVD process or the like. For example, the dielectric layer 114 may be formed using yttrium oxide, hafnium oxide, zirconium oxide, niobium oxide, barium titanium oxide, strontium titanium oxide or combinations thereof.

The conductive layer 116 for a control gate may have a multi-layered structure (not shown) including a doped polysilicon layer and a metal silicide layer formed on the doped polysilicon layer. The metal silicide layer may be formed using tungsten silicide, titanium silicide, cobalt silicide, tantalum silicide or combinations thereof.

The conductive layer 116, the dielectric layer 114, the polysilicon layer pattern 108 and the tunnel oxide layer pattern 106 may be sequentially patterned in a direction substantially perpendicular to a lengthwise direction of the active region to form a gate structure of a non-volatile memory device on the substrate 100.

According to example embodiments, when the slurry composition having a substantially high polishing selectivity of an oxide layer to a polysilicon layer is used for polishing an oxide layer to form an isolation layer, then the oxide layer may be more effectively polished using the polysilicon layer as a polishing stop layer without the assistance of a mask layer (e.g., a silicon nitride layer). The complexity of the process for manufacturing a semiconductor device may decrease and/or damage to the tunnel oxide layer may be prevented (or suppressed) because formation of the mask layer and removal of the mask layer may not be required.

FIGS. 11 to 17 are diagrams illustrating perspective views of methods of manufacturing a semiconductor device according to example embodiments.

Figure 11:
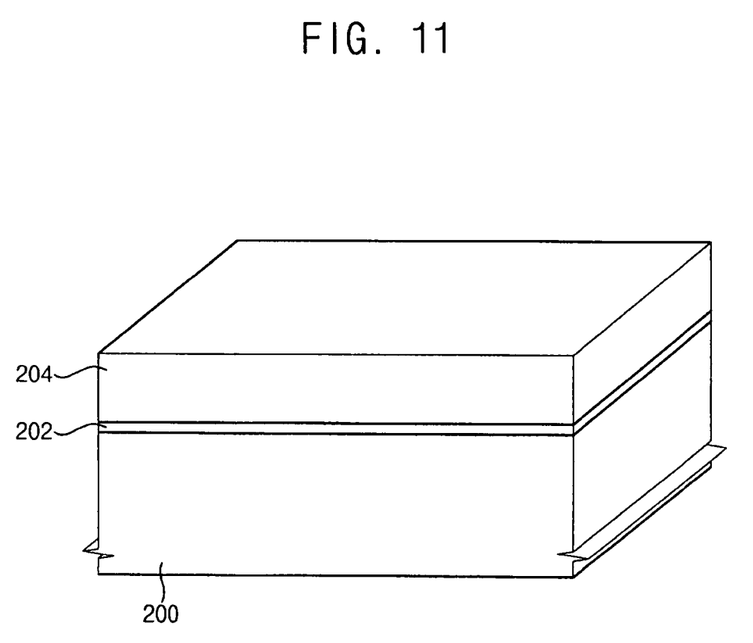
FIGS. 11 to 17 are diagrams illustrating perspective views of methods of manufacturing a semiconductor device according to example embodiments.

Referring to FIG. 11, a pad oxide layer 202 may be formed on a substrate 200. The pad oxide layer 202 may inhibit a mask layer 204 successively formed thereon from contacting the substrate 200. The pad oxide layer 202 may be formed by a thermal oxidation process. The mask layer 204 may be formed on the pad oxide layer 202. The mask layer 204 may be formed using silicon nitride.

Figure 12:
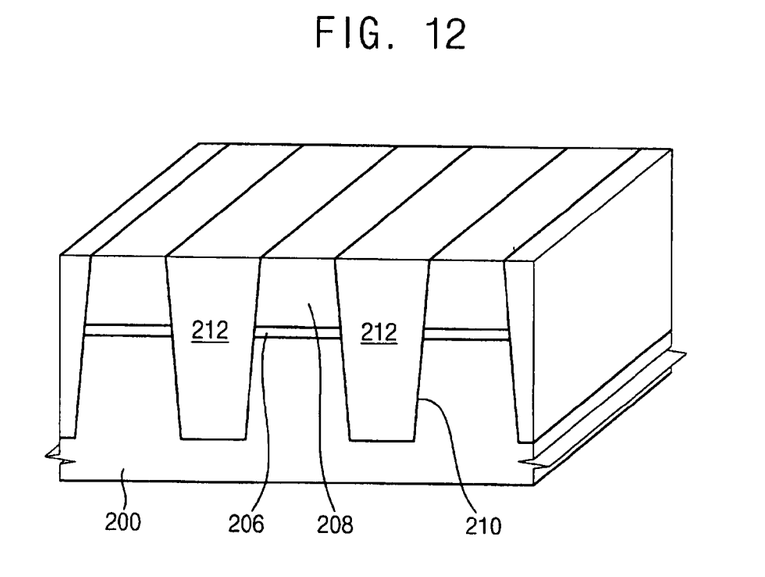

Referring to FIG. 12, a photoresist pattern (not illustrated) may be formed on the mask layer 204. The mask layer 204 and the pad oxide layer 202 may be partially etched using the photoresist pattern as an etching mask to form a mask 208 and a pad oxide layer pattern 206, respectively. The photoresist pattern may be removed from the substrate 200 by performing an ashing process and/or a stripping process.

The substrate 200 may be partially etched using the mask 208 and the pad oxide layer pattern 206 as etching masks to form a trench 210 at an upper portion of the substrate 200.

An isolation layer (not shown) may be formed on the mask 208 to fill up the trench 210. The isolation layer may be formed using a silicon oxide having desirable gap-filling characteristics. For example, the isolation layer may be formed using a silicon oxide (e.g., BPSG, PSG, BSG, USG, SOG, TEOS, PE-TEOS, HDP-CVD oxide or the like).

An upper portion of the isolation layer may be polished until the mask 208 is exposed to form a preliminary isolation layer pattern 212.

Figure 13:
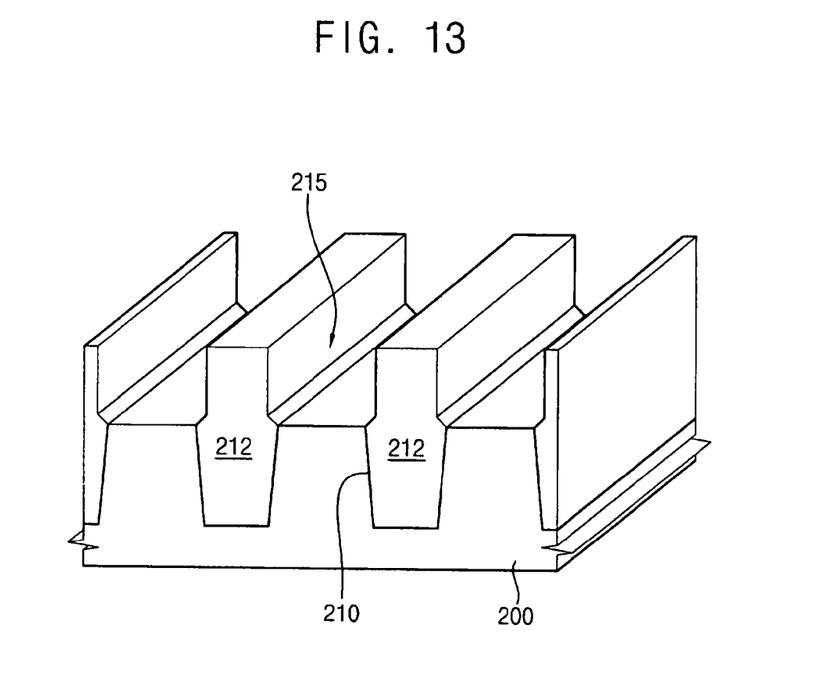

Referring to FIG. 13, the exposed mask 208 may be removed from the pad oxide layer pattern 206. In accordance with example embodiments, the mask 208 may be removed using a material that has a polishing selectivity relative to the preliminary isolation layer pattern 212. For example, when the mask 208 includes silicon nitride and the preliminary isolation layer pattern 212 includes silicon oxide, the mask pattern 208 may be removed by a wet etching process using a dilute phosphoric acid solution.

The pad oxide layer pattern 206 may be removed from the substrate 200. The pad oxide layer pattern 206 may be removed by a wet etching process. An opening 215 may be formed between the preliminary isolation layer patterns 212. The opening 215 establishes a region for forming a floating gate.

When the pad oxide layer pattern 206 is removed from the substrate 200 by the wet etching process, a portion of a sidewall of the preliminary isolation layer pattern 212 may be partially etched.

Figure 14:
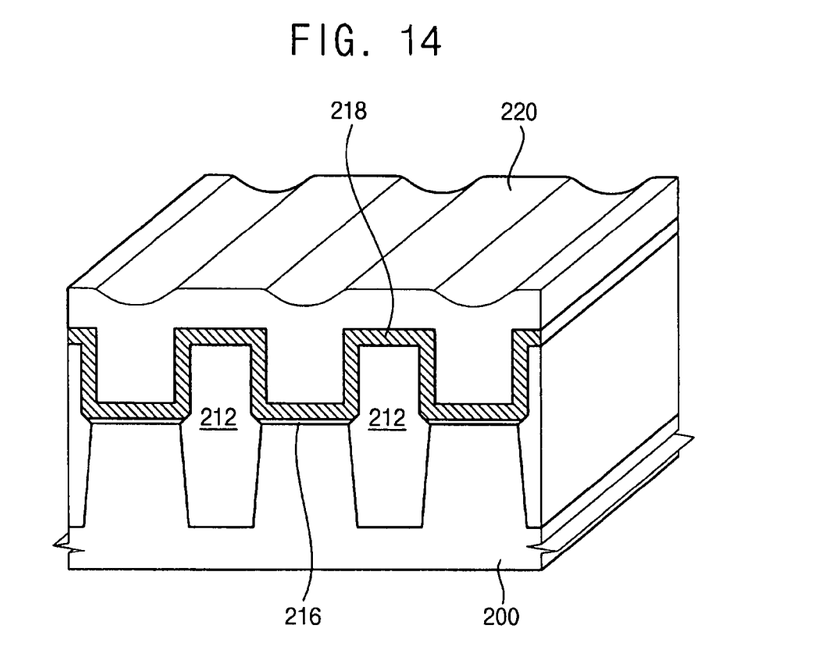

Referring to FIG. 14, a tunnel oxide layer 216 may be formed on portions of the substrate 200 exposed between the preliminary isolation layer patterns 212. The tunnel oxide layer 216 may be formed using silicon oxide. The tunnel oxide layer 216 may be formed by a process (e.g., a thermal oxidation process, a CVD process or the like).

A polysilicon layer 218 may be formed on the tunnel oxide layer 216 and sidewalls and an upper face of the preliminary isolation layer pattern 212. The polysilicon layer 218 may be converted into a floating gate electrode in a subsequent process.

According to example embodiments, the polysilicon layer 218 may be formed to partially fill up the opening 215. The polysilicon layer 218 may be formed using polysilicon doped with impurities.

A silicon oxide layer 220 may be formed on the polysilicon layer 218 to fill up the opening 215. The silicon oxide layer 220 may include BPSG, PSG, BSG, USG, SOG, TEOS, PE-TEOS, HDP-CVD oxide or the like.

Figure 15:
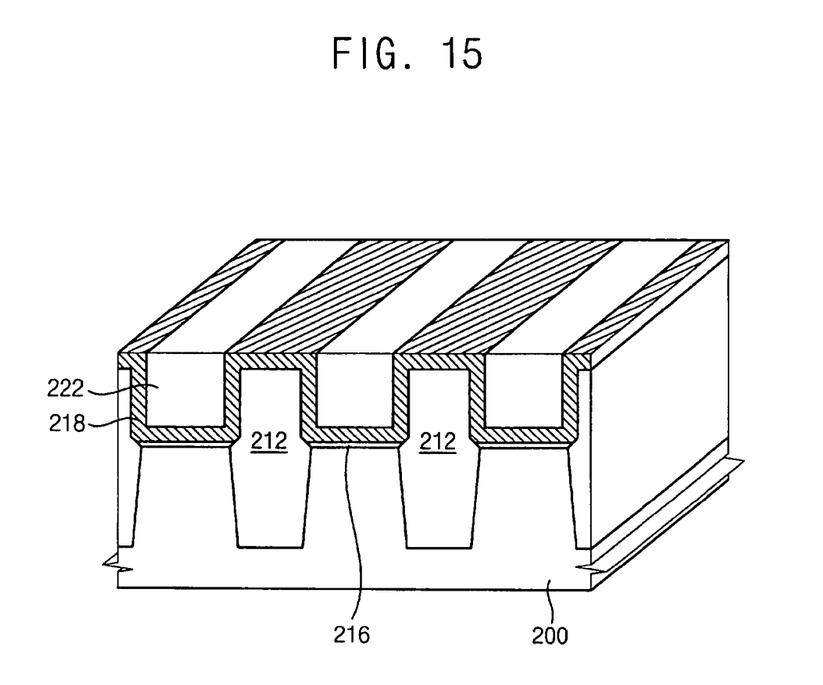

Referring to FIG. 15, the silicon oxide layer 220 may be partially removed by a polishing process (e.g., a CMP process) until the polysilicon layer 218 is exposed. An upper portion of the silicon oxide layer 220 positioned over the polysilicon layer 218 may be removed using the polysilicon layer 218 as a polishing stop layer.

In the polishing process for polishing the silicon oxide layer 220 using the polysilicon layer 218 as a polishing stop layer, a slurry composition that may have a substantially high polishing rate for the silicon oxide layer 220 and a substantially low polishing rate for the polysilicon layer 218 may be necessary. Polysilicon included in the polysilicon layer 218 may be hydrophobic. Silicon oxide included in the silicon oxide layer 220 may be hydrophilic. The polishing process may be performed using a slurry composition having a substantially high polishing selectivity of the hydrophilic layer to the hydrophobic layer.

A slurry composition including about 0.001 percent by weight to about 5 percent by weight of a ceria abrasive, about 0.001 percent by weight to about 0.1 percent by weight of a nonionic surfactant adsorbed onto a polysilicon layer to form a passivation layer on the polysilicon layer, the nonionic surfactant having a chemical structure of a triblock copolymer including a first polyethylene oxide block, a polypropylene oxide block and a second polyethylene oxide block and a remainder of water may be provided on a polishing pad. The silicon oxide layer 220 may be polished by rubbing the silicon oxide layer 220 with the polishing pad to partially remove the upper portion of the silicon oxide layer 220 from the substrate 200. The polishing process may be performed until the polysilicon layer 218 is exposed.

The polishing process and the slurry composition were previously described therefore any further explanations will be omitted for the sake of brevity.

Figure 16:
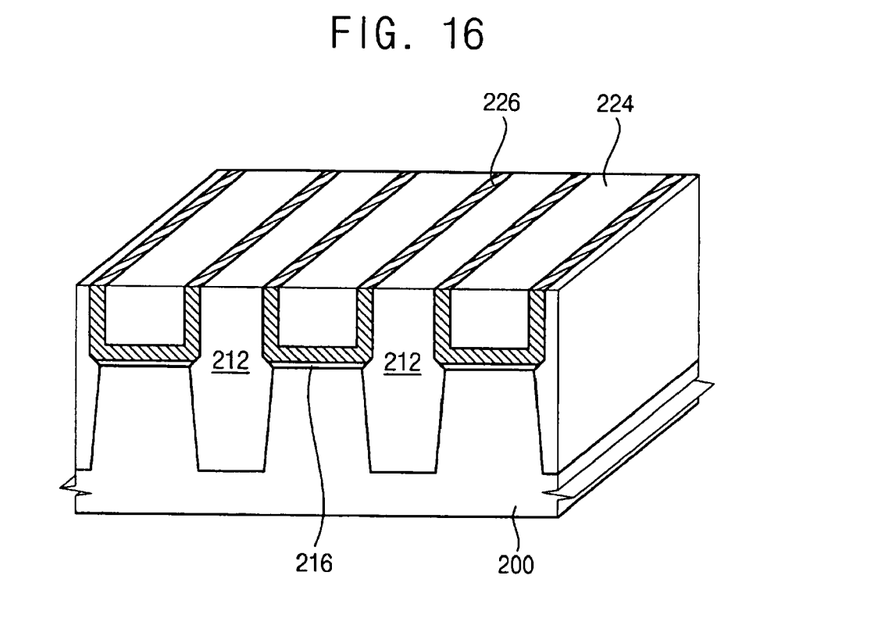

Referring to FIG. 16, an exposed portion of the polysilicon layer 218 may be partially removed until an upper surface of the preliminary isolation layer pattern 212 is exposed to form a preliminary floating gate electrode 226. The preliminary floating gate electrode 226 may be isolated in a direction substantially perpendicular to a lengthwise direction of the active region.

A second photoresist pattern (not illustrated) may be formed on the preliminary floating gate electrode 226 and the silicon oxide layer pattern 224. The second photoresist pattern may be formed to cover a region in which a floating gate electrode 228 (see FIG. 17) will be formed.

Figure 17:
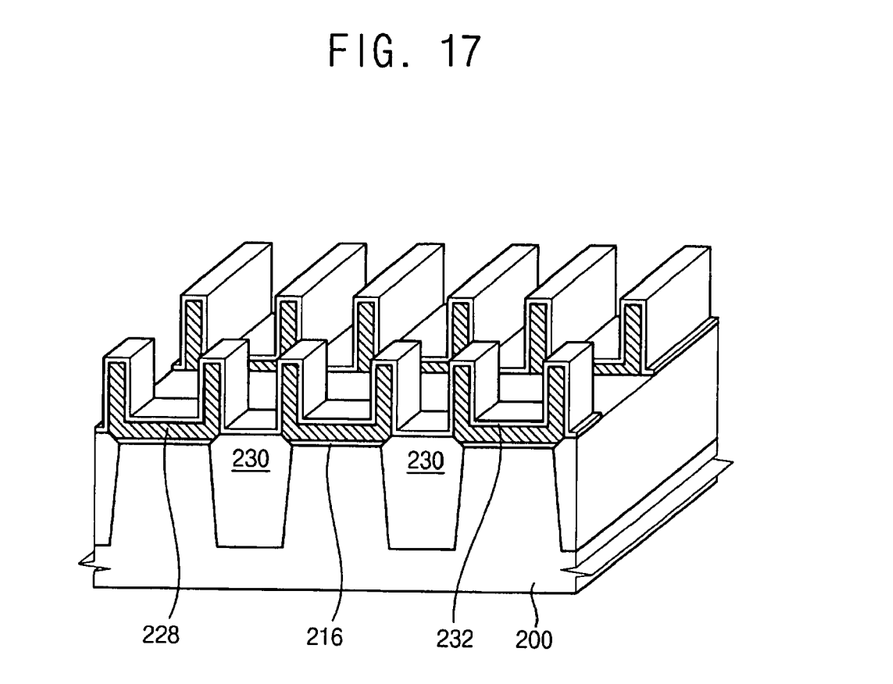

Referring to FIG. 17, the preliminary floating gate electrode 226 may be partially etched using the second photoresist pattern as an etching mask to form the floating gate electrode 228 having an isolated U-shape.

The second photoresist pattern may be removed from the substrate 200 by an ashing process and/or a stripping process after forming the floating gate electrode 228.

The silicon oxide layer pattern 224 remaining inside of the floating gate electrode 228 may be removed from the substrate 200. An upper portion of the preliminary isolation layer pattern 212 adjacent to the sidewall of the floating gate electrode 228 may be removed from the substrate 200. As such, an isolation layer pattern 230 may be formed having a height substantially lower than that of the preliminary isolation layer pattern 212.

After the silicon oxide layer pattern 224 and the upper portion of the preliminary isolation layer pattern 212 are removed, an upper surface, lateral sides, a front side and a back side of the floating gate electrode 228 may be exposed.

A dielectric layer 232 may be formed on the floating gate electrode 228 and the isolation layer pattern 230. The dielectric layer 232 may have a multi-layered structure in which a lower oxide layer, a nitride layer and an upper oxide layer are subsequently stacked.

As mentioned above, the floating gate electrode 228 may be an isolated U-shape pattern including exposed portions (e.g., the upper surface, the lateral sides, the front side, the back side, etc.). As such, the floating gate electrode 228 may have a substantially large surface area. The dielectric layer 232 formed on the floating gate electrode 228 may also have a substantially large surface area. A coupling ratio of a unit cell in a non-volatile memory device may be sufficiently increased.

A conductive layer (not illustrated) may be formed on the dielectric layer 232. The conductive layer may have a multi-layered structure in which a doped polysilicon layer is formed. A metal layer or a metal silicide layer may be formed on the doped polysilicon layer.

The conductive layer and the dielectric layer 232 may be patterned by a photolithography process to form a control gate electrode (not shown) and a dielectric layer pattern (not shown), respectively. Thus, a gate structure of a non-volatile memory device is formed on the substrate 200. The gate structure includes the control gate electrode, the dielectric layer pattern, the floating gate electrode 228 and the tunnel oxide layer pattern 216.

According to example embodiments, the slurry composition includes a nonionic surfactant that may adsorb onto a polysilicon layer to form a passivation layer on the polysilicon layer. The nonionic surfactant may protect the polysilicon layer from a ceria abrasive in a polishing process for polishing a silicon oxide layer. The slurry composition may have polishing characteristics substantially similar to that of conventional slurry compositions that have a substantially high polishing rate for a silicon oxide layer and a substantially low polishing rate for a silicon nitride layer. The slurry composition may exhibit a substantially high polishing rate for a hydrophilic layer (e.g., the silicon oxide layer) and a substantially low polishing rate for a hydrophobic layer (e.g., the polysilicon layer).

The slurry composition may have a substantially high polishing selectivity between the silicon oxide layer and the polysilicon layer. Although a particle size of a ceria abrasive included in the slurry composition is reduced, the slurry composition may exhibit increased polishing characteristics. Uniformities in a surface and a thickness of the polysilicon layer functioning as a floating gate electrode may be increased by manufacturing semiconductor devices using the slurry composition. The slurry composition may reduce damage to the polysilicon layer, increasing the reliability of the semiconductor device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor memory device, the method comprising:
    forming a polysilicon layer pattern on a substrate;
    partially etching the substrate using the polysilicon layer pattern as an etching mask forming a trench at an upper portion of the substrate;
    forming a silicon oxide layer on the substrate covering the polysilicon layer pattern and filling up the trench;
    polishing the silicon oxide layer using a slurry composition until the polysilicon layer pattern is exposed forming an isolation layer in the trench, the slurry composition including about 0.001 percent by weight to about 5 percent by weight of a ceria abrasive, about 0.001 percent by weight to about 0.1 percent by weight of a nonionic surfactant adsorbed onto the polysilicon layer pattern forming a passivation layer on the polysilicon layer pattern, the nonionic surfactant having a triblock copolymer chemical structure including a first polyethylene oxide block, a polypropylene oxide block and a second polyethylene oxide block, and a remainder of water; and
    forming a structure on the substrate including the isolation layer, the structure including a gate insulation layer and a conductive pattern.

2. The method of claim 1, wherein the first and the second polyethylene oxide blocks have a hydrophilic-lipophilic balance (HLB) value in a range of about 10 to about 15 respectively, and the polypropylene oxide block has an HLB value in a range of about 28 to about 32.

3. The method of claim 1, wherein a polishing selectivity of the silicon oxide layer relative to the polysilicon layer pattern is in a range of about 100:1 to about 150:1.

4. The method of claim 1, further comprising adjusting a pH value of the slurry composition in a range of 7 to 12 prior to polishing the silicon oxide layer.

5. The method of claim 1, further comprising dispersing the ceria abrasive using a dispersing agent prior to polishing the silicon oxide layer.

6. The method of claim 5, wherein the dispersing agent is about 0.5 percent by weight to about 3.5 percent by weight of the slurry composition.

7. The method of claim 1, wherein the triblock copolymer chemical structure is represented by Formula (1), Formula (1)

wherein x, y and z independently represent integers in a range of 10 to 1,000.

8. The method of claim 1, wherein the slurry composition includes about 0.1 percent by weight to about 3.5 percent by weight of the ceria abrasive, and about 0.005 percent by weight to about 0.055 percent by weight of the nonionic surfactant.

* * * * *